US012139793B2

United States Patent
Bode et al.

(10) Patent No.: US 12,139,793 B2
(45) Date of Patent: Nov. 12, 2024

(54) CVD DEVICE COMPONENT PROVIDED WITH AN INDIVIDUAL IDENTIFIER, AND METHOD FOR COMMUNICATING INFORMATION

(71) Applicant: AIXTRON SE, Herzogenrath (DE)

(72) Inventors: Matthias Johannes Bode, Gemmenich (BE); Thomas Schmitt, Mönchengladbach (DE); Micha Cornel Franke, Herzogenrath (DE); Markus Mohnen, Herzogenrath (DE)

(73) Assignee: AIXTRON SE, Herzongenrath (DE)

( * ) Notice: Subject to any disclaimer, the term of this patent is extended or adjusted under 35 U.S.C. 154(b) by 961 days.

(21) Appl. No.: 17/041,727

(22) PCT Filed: Mar. 26, 2019

(86) PCT No.: PCT/EP2019/057493
§ 371 (c)(1),
(2) Date: Sep. 25, 2020

(87) PCT Pub. No.: WO2019/185574
PCT Pub. Date: Oct. 3, 2019

(65) Prior Publication Data
US 2021/0010138 A1    Jan. 14, 2021

(30) Foreign Application Priority Data
Mar. 26, 2018    (DE) ...................... 10 2018 107 135.3

(51) Int. Cl.
C23C 16/52    (2006.01)
G06K 19/06    (2006.01)

(52) U.S. Cl.
CPC ........ *C23C 16/52* (2013.01); *G06K 19/06028* (2013.01); *G06K 19/06037* (2013.01)

(58) Field of Classification Search
CPC ....... G06K 19/06028; G06K 19/06037; G06K 7/087; C23C 16/52
See application file for complete search history.

(56) References Cited

U.S. PATENT DOCUMENTS 3,636,317 A    1/1972   Torrey
9,568,421 B2 *  2/2017  Farmer ................ G01N 21/534
(Continued)

FOREIGN PATENT DOCUMENTS

DE    4 306 209 A1    9/1994
DE   10 2008 055 582 A1    6/2010
(Continued)

OTHER PUBLICATIONS

International Search Report mailed Jul. 2, 2019, from the ISA/European Patent Office, for International Patent Application No. PCT/EP2019/057493 (filed Mar. 26, 2019), 7 pgs.
(Continued)

*Primary Examiner* — Edmond C Lau
*Assistant Examiner* — Mohamed Doumbia
(74) *Attorney, Agent, or Firm* — Ascenda Law Group, PC (57) ABSTRACT

Information is communicated to a process control device by performing a process that includes the step of heating a component, the component having structured volumetric regions. When the component is heated, structures present in the volumetric regions radiate in the infrared spectrum, allowing the structures to be distinguished by an infrared sensor. The structures, formed by elevations or depressions, form a machine-readable identifier, which can be used as an originality identification means for the component. Since the identifier can be determined in situ during a heating process, the process control device can recognize whether correction values are to be used for the thermal treatment of a substrate.

11 Claims, 5 Drawing Sheets

(56) References Cited

U.S. PATENT DOCUMENTS

2015/0292815 A1* 10/2015 Ranish ............... C23C 16/4581
                                                                165/185
2017/0323186 A1   11/2017 Valdes Garcia et al.

FOREIGN PATENT DOCUMENTS

| DE | 10 2012 108 986 A1 | 3/2014 |
|----|--------------------|--------|
| DE | 10 2013 012 082 A1 | 1/2015 |
| DE | 10 2013 114 412 A1 | 6/2015 |
| EP | 2 160 759 B1 | 8/2011 |
| WO | 2015/170306 A2 | 11/2015 |

OTHER PUBLICATIONS

Written Opinion mailed Jul. 2, 2019, from the ISA/European Patent Office, for International Patent Application No. PCT/EP2019/057493 (filed Mar. 26, 2019), 3 pgs.
Written Opinion mailed Jul. 2, 2019, from the ISA/European Patent Office, for International Patent Application No. PCT/EP2019/057493 (filed Mar. 26, 2019), English translation, 5 pgs.
International Preliminary Report on Patentability issued Sep. 29, 2020, from The International Bureau of WIPO, or International Patent Application No. PCT/EP2019/057493 (filed Mar. 26, 2019), 12 pg.s.

* cited by examiner

CVD DEVICE COMPONENT PROVIDED WITH AN INDIVIDUAL IDENTIFIER, AND METHOD FOR COMMUNICATING INFORMATION

RELATED APPLICATIONS

This application is a National Stage under 35 USC 371 of and claims priority to International Application No. PCT/EP2019/057493, filed 26 Mar. 2019, which claims the priority benefit of DE Application No. 10 2018 107 135.3, filed 26 Mar. 2018.

FIELD OF THE INVENTION

The invention relates to a component of a device for the thermal treatment of at least one substrate, whereby, in the course of the thermal treatment, the component is heated with a heating unit to a temperature, at which surface regions of differently structured volumetric regions of the component can be distinguished from one another with a temperature sensor, for example, an infrared sensor, on the basis of the level of the sensor signal.

The invention further relates to a device for the thermal treatment of at least one substrate with at least one controller, and one component, which, in the course of the thermal treatment, is heated with a heating unit to a temperature at which surface regions of differently structured volumetric regions of the component can be distinguished from one another with a sensor, on the basis of the level of the sensor signal.

The invention also relates to a method for the communication of information to a process control device, and a method for the correction of process parameters.

BACKGROUND

Components that are constituents of a CVD reactor are described, for example, in EP 2 160 759 B1, DE 10 2013 012 082 A1, DE 10 2012 108 986 A1, or DE 10 2008 055 582 A1.

From U.S. Pat. No. 9,568,421 B2 or US 2017/0323186 A1, methods and devices for the provision of objects with an individual identifier are of known art. Originality identifications and machine-readable character arrangements are also described in WO 2015/170306 A2 and U.S. Pat. No. 3,636,317.

A CVD reactor according to the invention possesses a process chamber, which is surrounded by walls. The walls of the process chamber are formed by components of a heat-resistant material, such as ceramic, quartz, graphite or molybdenum. The components are heated in the course of the thermal treatment of a substrate, for example in the course of the deposition of a layer on a substrate. For the deposition of the layer, process gases are fed into the process chamber, which gases are pyrolytically decomposed there. The decomposition products, in particular a metal-organic compound of an element of the III-main group, and a hydride of an element of the V-main group, are deposited to form a layer on the surface of the substrate. The quality of the deposited layer depends to a large extent on the achievement of a desired temperature profile in the process chamber. For example, it is necessary that any lateral temperature gradient on a susceptor, which is carrying the substrates, vanishes as far as possible. In some process chambers according to the invention, the susceptor is heated from underneath, and a process chamber ceiling that is opposite the susceptor is cooled. However, other arrangements are also provided, in which the process chamber ceiling is also heated. Certain physical, in particular geometric, features of the component, in particular of the susceptor, have, for example, a large influence on process variables, such as temperatures, or temperature profiles, in the process chamber. In order to be able to execute the thermal treatment process and in particular the deposition of a layer with reproducible results, it is necessary that the desired process variables are reliably kept within narrow tolerance limits. In order to achieve the desired process variables, actuators, such as heaters, or mass flow controllers, for the adjustment of flushing flows, are adjusted by means of the process parameters of a formulaic specification. The process parameters of the formulaic specification can be designed such that the desired process variables in the process chamber are achieved with standard values of the physical features of the components. If the physical features alter because, for example, one component has been replaced with another component, the process variables also alter, if the process parameters are not altered. The replacement of a component can thus influence the temperature profile within the process chamber, and thereby the quality of the layers therein deposited on substrates. The physical variables considered here are particularly tolerance-affected variables, such as the average layer thickness of a coating of the surface of the component, the surface roughness, the optical emissivity of the surface, or certain length, width, or thickness values of the component.

After the replacement of a component, it is often necessary to modify the process parameters of the formulaic specification, in order to achieve the desired process variables within the process chamber.

SUMMARY OF THE INVENTION

The object underlying the invention is in the first instance that of the specification of means with which the manipulation of a device for the thermal treatment of a substrate is improved.

The object is achieved by the invention specified in the claims, whereby the subsidiary claims are not only advantageous further developments of the secondary claims, but are also independent solutions of the object.

Firstly and essentially, the structures proposed are those with which regions that differ from one another, in particular volumetric regions, are structured. These take the form of structures that influence a local surface temperature of the component, and collectively result in a machine-readable individual identifier. The individual identifier can be determined with a sensor, in particular a temperature sensor, that is to say, for example, an infrared sensor. In particular, a pyrometer is used, with which a local temperature on the surface of the component, which can take the form of a susceptor, a side part, a ceiling, or a cover plate of a process chamber of a CVD reactor, can be locally determined. The individual identifier can be registered either by a rotation of the component, or by a movement of the sensor's measuring point over the surface of the component. Provision is made in particular that the sensor is an optical temperature sensor, with which a controller of the device receives information about the actual temperature of the component, in particular the actual temperature of a susceptor, and whereby this temperature is preferably used by the controller to regulate the temperature of the component. The identifier is preferably read with this already existing optical temperature sensor, arranged for example at one end of a fiber optic cable, the other end of which is directed towards the component. For this purpose, it is only necessary to heat the component to a temperature of, for example, more than 500° C., such that the surface of the component radiates in an infrared frequency spectrum, which can be registered by the sensor. The different structures, which in particular are adjacent to one another, can be distinguished from one another on the basis of their radiation intensity or their radiation spectrum. The temperature sensor preferably takes the form of an infrared sensor, which has infrared optics, with which it is possible to determine the temperature of small surface regions. In particular, such sensors take the form of sensors that measure with a high spatial resolution. The structures, which can be distinguished on the basis of their radiation intensity or their radiation spectra, are preferably arranged on a rear face of the component, the front face of which faces towards the process chamber. According to one aspect of the invention, a surface temperature of the external surface of the component, which faces towards a heating unit, is determined by means of the temperature sensor. This can be done with the above-cited temperature sensor, arranged at the end of a fiber optic cable. The other end of the fiber optic cable terminates at a small distance from the external surface of the component, whose temperature is to be measured. According to one alternative, provision is made for the temperature to be determined on the front face of the component, which faces away from the rear face. The front face, the temperature of which is measured by the temperature sensor, can be configured as a smooth wall, or can be provided with other structures, for example with depressions or ribs for the positional fixation of the substrates. The volumetric regions, which are provided with structures, can have elevations or depressions on their surfaces. The volumetric regions can, however, also have cavities, with which the volumetric regions are structured, such that the surface regions associated with them, facing towards the IR-sensor, can be distinguished by the level of the temperature measurement signal. The structural regions can also be surface regions. Thus, in particular, provision is made for adjacent structural regions of the surface to differ in terms of the character of the surface. The surface finish can be configured by means of roughening, polishing, or by the application of colored pigments, and in particular can be configured in a variety of ways. The structures can be arranged along a circular arc line of a component that can be driven such that it rotates about the center of the circular arc line. In particular, such a component takes the form of a susceptor. On such an arrangement of the structures, the measuring point of the infrared sensor does not need to move. The measuring point can remain stationary with respect to the process chamber, since the component moves underneath the measuring point. In one alternative, provision is made for the component to be stationary relative to the process chamber. Here, the structures can be arranged in a straight line, located one behind another. However, provision is also made for the structures to be arranged on a surface. The read-out of the individual identifier, which is formed by the structures, is then undertaken with a moving measuring point. The line or surface is scanned by the infrared sensor in the same way as by a barcode reader. The structures that provide the individual identifier preferably have structural elements that are equally spaced apart from one another. The structural elements of the structures can be arranged in the manner of a barcode or a QR code. The structures, that is to say, the structural elements, are arranged as a structural unit on the component, and are formed in particular by regions with different material thicknesses between a front face and a rear face.

The invention also relates to a method for the individualization of a component. Each of a multiplicity of components, which are otherwise configured in the same way, is provided with an individual identifier. For this purpose, as described above, volumetric regions of the component, which are associated with adjacent surface regions, are provided with spatial structures. These preferably take the form of structures that radiate in the infrared spectrum, such that they can be distinguished from one another when the component is heated. Collectively, the structures result in a machine-readable individual identifier of the component. The identifier can be a multiple-digit numeric character sequence; in the simplest case this takes the form of a bit sequence, which can be characterized in that the value zero signifies no depression, or no elevation, and the value one signifies a depression, or an elevation. The identifier can, however, also be formed by elevations or depressions with different heights or depths. In addition to a numeric character sequence, an alphanumeric character sequence is also conceivable. The thermal image generated by the spatial structures is registered by a temperature sensor, which in particular has high spatial resolution. The sensor signal is evaluated and converted into the character sequence. This is undertaken on a computer unit. Provision can also be made for the character sequence to contain a coded or encrypted value, to achieve, for example, a measure of forgery security. The encoded value can be a checksum or a hash value. It is also possible to encrypt the identifier with one key of a pair of keys consisting of a public and a private key.

In a further development of the invention an indication of what is, in particular, a tolerance-affected physical feature of the component, can be included in the individual identifier. The tolerance-affected physical feature can be, for example, the thickness of a coating, properties of the surface, such as reflectivity or emissivity, the length, width, thickness of the component, or the dimensions of a surface depression, or a surface projection. These particularly tolerance-affected physical features are first determined on an as yet unidentified component. An individual identifier is then generated using an encryption function, in which the physical feature measured on the component is included. The identifier is then attached to the component, for example, by material removal in the manner described above, such as by the creation of depressions.

The invention also relates to a method for the communication of information to a process control device, which uses process parameters stored in a formulaic specification to control a thermal treatment process of a substrate by adjusting mass flows of gases or heating setting values specified in the formulaic specification, for example by the specification of control temperatures that must be achieved at prescribed measuring points in the process chamber. In the inventive method, a component is initially prepared, for example, manufactured, which bears an individual identifier, which can be optically read, for example, using an image-recognition method, for example with a camera, but can also be machine-read with a scanning laser beam. This can also take place at room temperature. Preferably, however, the identifier is configured such that it is only machine-readable with an infrared sensor when the component is heated. For this component, values, in particular of tolerance-affected physical features, are determined. This can take place here after the individual identifier has been applied. The component is measured with regard to those physical features that particular influence the process. These measured values can be communicated, together with the identifier, to a controller of a device for the thermal treatment of a substrate. Provision can be made for the controller to have a computational program, which can determine the influences of the physical features on process parameters. In particular, provision is made for the influences that the physical features have on the values of process variables to be determined. This can be done manually from experience. Model calculations can, however, also be carried out for this purpose. Provision is also made for tests to be undertaken, in which the component is heated under process conditions and a temperature profile within the process chamber is recorded. Correction values are then also determined, either on the basis of model calculations, or also experimentally, with which the process parameters, that is to say, the values for controlling the heating power or the mass flows of gases, are corrected such that the desired process variables, that is to say, in particular the temperatures within the process chamber, can be achieved. These correction values can be used when the device with the component bearing the individual identifier is used. However, provision is also made to assign these correction values logically to the respective individual identifier of the component. This preferably takes place when the model calculations have not been carried out by the process control device itself, but by another computer unit. To this end, for example, a file can be created that contains not only the correction values, but also the individual identifier, or whose file name is the individual identifier. However, provision is also made for the correction values and the individual identifier to be logically linked together in a centralized, or a decentralized, database. The correction values of the process control device are communicated together with the identifier. This can take place by submitting a link to a file, by allowing access to a local or central database, or by way of traditional communication channels, such as letter or telephone. In an inventive method for the correction of process parameters of a formulaic specification, the correction values thereby communicated to the process control device are used to modify the process parameters stored in a formulaic specification. The method is in particular used if a component is removed from a CVD reactor and replaced with another component. The process chamber, and in particular the component, are heated to a temperature at which the identifier can be detected with the aid of the infrared sensor already present in the process chamber. The identifier, radiating at the target temperature in the infrared spectrum, is determined by means of the infrared sensor. Based on the logical assignment of correction values to the individual identifier, the formulaic specification can then be modified by modifying selected process parameters on the basis of the correction values.

Provision can also be made that with the aid of the infrared sensor, or with the aid of other sensors or measuring elements arranged in the device, at least one physical feature of the component arranged in the process chamber is determined. The measured individual identifier of the component is then decrypted. The physical feature can be read out from the decrypted values. This can be compared with the physical feature measured in situ. If there is a match, the component can be considered to be an original part. If the value of the physical feature measured in situ is outside a range around the value obtained from the individual identifier, the component cannot be considered to be an original part.

Another aspect of the invention relates to the activation of functions of the controller. For example, provision can be made that certain functions of the controller can only be used if the individual identifier of the component, which is preferably determined within the device when the device is closed, belongs to a group of permissible individual identifiers. This provision is intended in particular for the case when the program for the execution of the method on the device receives an update.

BRIEF DESCRIPTION OF THE FIGURES

In what follows, example embodiments of the invention are explained with the aid of the accompanying figures. Here.

DETAILED DESCRIPTION

Figure 1:
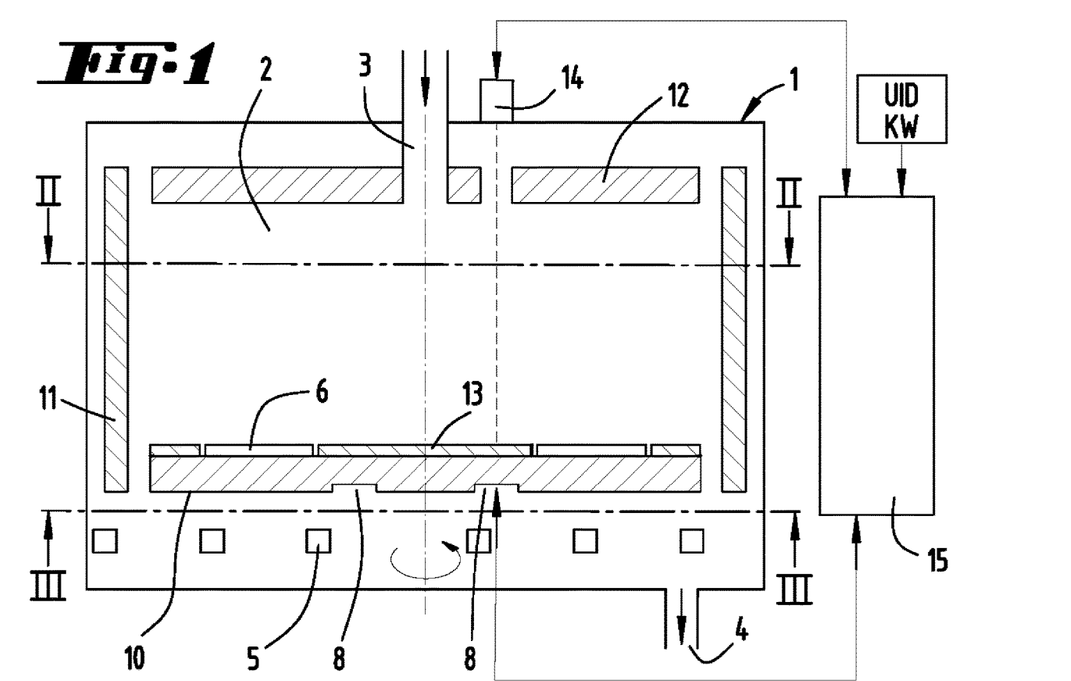
FIG. 1 shows schematically a cross-section through a CVD reactor 1 and a process chamber 2 arranged therein, together with a process control device 15.
Figure 2:
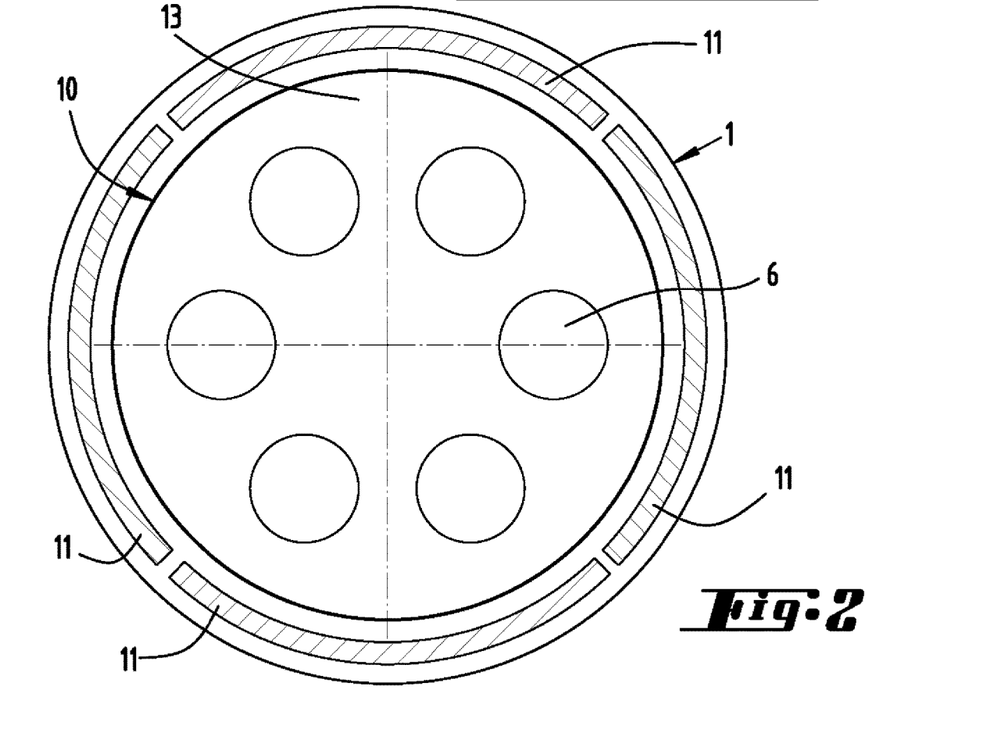
FIG. 2 shows schematically the section along the line II-II in FIG. 1, which corresponds to a plan view onto the susceptor 10.

The CVD reactor 1, shown schematically in FIG. 1, has a gas-tight housing, in which a process chamber 2 is located. The process chamber 2 has a susceptor 10, which can be formed by a graphite part, a molybdenum part, a quartz part or a ceramic part. Underneath the susceptor 10 is a heater 5 for purposes of heating the susceptor 10 to temperatures above 500° C., or above 700° C.

On the upper face of the susceptor 10, facing towards a process chamber ceiling 12, is located a cover plate 13, which can also consist of a plurality of parts. The cover plate 13 has circular openings, in which are arranged substrates 6; these are to be coated with a layer in the process chamber 2.

The process chamber ceiling 12 and side parts 11, which surround the process chamber 2, are also made of graphite, molybdenum, quartz, or ceramic.

For purposes of depositing a layer onto the substrates 6, a process gas, which can consist of a plurality of gases, is fed into the process chamber 2 with the aid of a gas inlet 3. The constituents of the gases decompose in the process chamber 2, so that a layer is deposited onto the substrates 6. Reaction products, or a carrier gas, which is also fed in through the gas inlet 3, can subsequently leave the CVD reactor 1 through a gas outlet 4. A vacuum pump can be connected to the gas outlet 4. Metal-organic compounds of the III-main group and hydrides of the V-main group are in particular used as the process gases; these are fed in, together with a carrier gas, for example hydrogen, by means of a gas inlet element in the process chamber 2, which is not shown in the figures, but is of known art from other prior art.

The susceptor 10 is heated from underneath with a heater 5, which can take the form of an infrared heater, or an RF-heater. At the same time, the side parts 11 and the process chamber ceiling 12 are also heated to an elevated temperature.

The surface temperature of a cover plate 13, or of the susceptor 10 located below the cover plate 13, can be measured in a manner of known art with an infrared sensor 14, for example, a pyrometer. Further IR-sensors 14, not shown in FIG. 1, are provided, with which the surface temperatures of the side parts 11, the ceiling 12, the cover plate 13, or the susceptor 10, can be determined. The susceptor 10, the side parts 11, the ceiling 12, and the cover plate 13, collectively form the components, the surfaces of which, when heated, radiate in the infrared spectrum. The temperatures on the rear face and the front face can differ from one another, so that heat flows through the component.

According to the invention, provision is made for at least one of the components 10, 11, 12, 13, preferably the susceptor 10, to be provided with an individual identifier 16, wherein the individual identifier is preferably assigned volumetric regions, through which heat flows by virtue of a temperature gradient. As a result of different effective material thicknesses of the components 10, 11, 12, 13, locally different surface temperatures are established on the surfaces facing away from the heat source.

Figure 3:
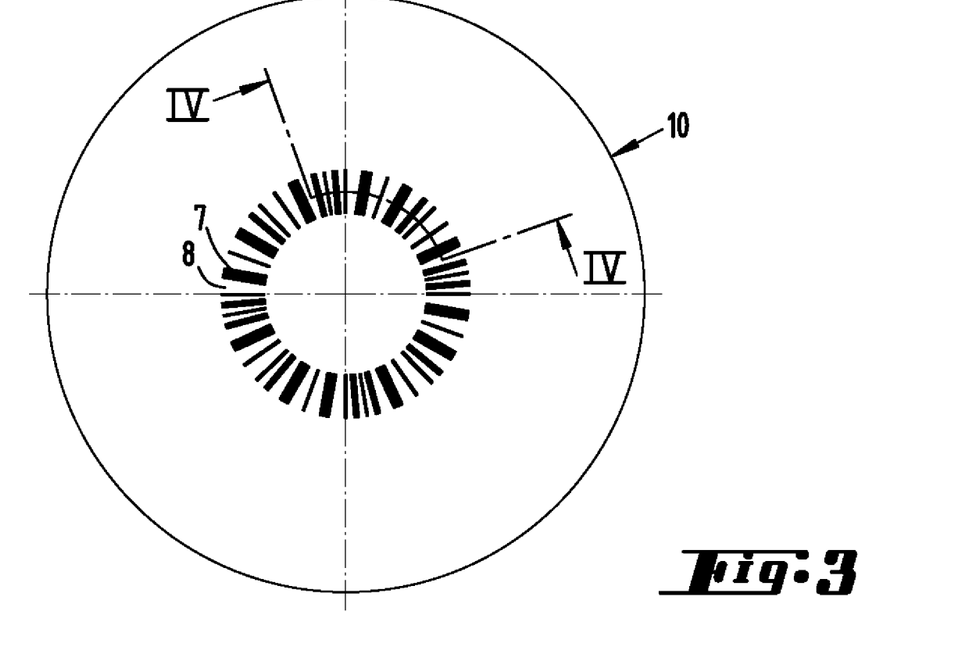
FIG. 3 shows the section along the line III-III in FIG. 1, corresponding to a bottom view of the susceptor 10.

The susceptor 10, which can be rotated around an axis of rotation, has an identifier 16 extending along a circular arc line about the turning center of the susceptor 10. The identifier 16 can be formed from elevations 7 arranged on the circular arc line, which are spaced apart from one another, and/or from depressions 8, which are spaced apart from one another. The elevations 7 or depressions 8 can have a different width in the direction of the arc of the circular arc line. These depressions 8 or elevations 7 influence the effective material thickness of the component.

Figure 4:
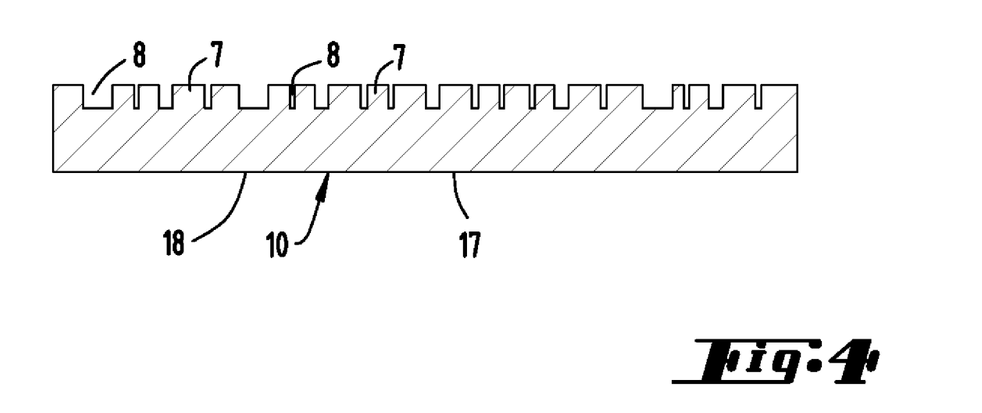
FIG. 4 shows the section along the line IV-IV in FIG. 3 for the clarification of structures 7, 8 on the susceptor 10, which are shown here in a highly exaggerated manner in the interests of clarity.

As FIG. 4 shows, the structures formed by the elevations and the depressions 8 are arranged on the rear face facing towards the heater 5. The elevations 7 and the depressions 8 influence the heat transport through the susceptor 10 such that temperatures that differ from one another are measured in surface regions 17, which are opposite the elevations 7, and in surface regions 18, which are opposite the depressions 8. If the heat transport from the heater to the lower face of the susceptor 10 essentially takes place by heat radiation, the heat transport distance in the region of the depression 8 to the opposite surface region 18 is less than the heat transport distance in the region of an elevation 7 to the opposite surface region 17. As a result, the surface temperature in the surface region 18 is slightly higher than that in the surface region 17.

With the infrared sensor 14, which in particular has an optical system, the temperature can be measured at a spatially narrowly defined measuring point. If the susceptor 10 is now rotated around its axis of rotation, the measuring point of the infrared sensor 14 moves along a circular arc line over the upper face of the susceptor 10, which has the structures 7, 8 on the same circular arc line on the lower face. The result is a time-dependent temperature sensor signal, from which a rectangular signal can be formed. This rectangular signal represents pulse sequences. A bit signal can be obtained from the length of the pulses of the pulse sequences. The bit signal represents an individual identifier 16 of the component 10.

Figure 5:
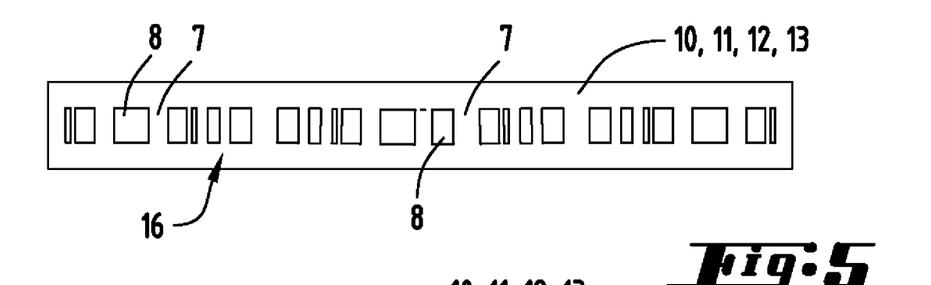
FIG. 5 shows a plan view onto one of the components 10, 11, 12, 13 with an individual identifier 16, arranged along a straight line, formed by depressions 8 and elevations 7.

In the example embodiment shown in FIG. 5, a multiplicity of depressions 8 are arranged one behind another in a straight line. The structures arranged one behind another can, however, also be formed by elevations 7 arranged on a line. For the determination of the individual identifier 16 formed by the elevations 7, or depressions 8, a measuring point of the IR-sensor 14, can, for example with the use of suitable mirrors, move over the surface of the component 10, 11, 12, 13.

Figure 6:
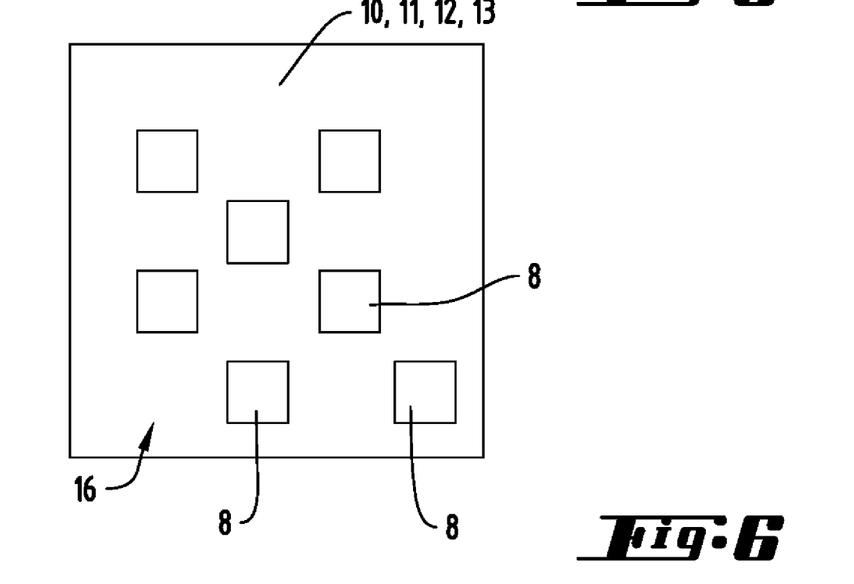
FIG. 6 shows an individual identifier 16 in the form of depressions 8 arranged on a surface.

In the example embodiment shown in FIG. 6, the structures, in particular the depressions 8, are arranged on a surface. Here, the measuring point can be scanned over the surface so as to read out the individual identifier. The structures are arranged here in the manner of a QR-code, and can also be encoded in the same way, so that the structures can be read out using a QR-code scanning method.

In the example embodiment shown in FIG. 3, and in other example embodiments that are not shown, the structures are arranged in the manner of a barcode, and can be recognized using a barcode read-out method.

Figure 7:
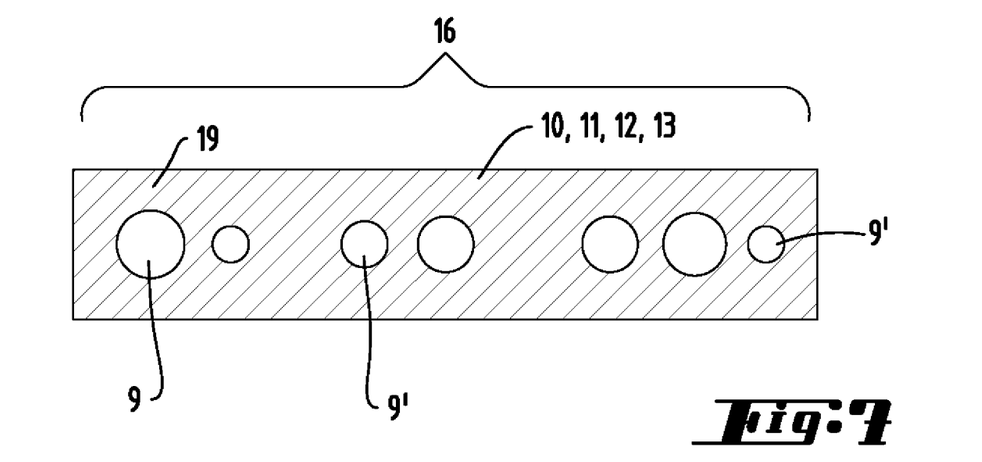
FIG. 7 shows an individual identifier 16 in the form of cavities 9, 9' within the volume of a component 10, 11, 12, 13.

In the example embodiment shown in FIG. 7, the identifier 16 is achieved by means of cavities 9, 9' within the component 10, 11, 12, 13. The cavities 9, 9' can take the form of holes, which have been introduced from the narrow face around the component 10, 11, 12, 13. The cavities 9, 9' can be holes with diameters that differ from one another. The holes are also arranged at separation distances that differ from one another. In particular, provision is made for surface regions of the same size, adjacent to one another, to be structured such that they either have a hole with a large diameter, or a hole with a small diameter, or no hole at all. The holes 9, 9', together with the elevations 7 and the depressions 8, influence the heat transport from a broad face of the component to the opposite broad face of the component, so that the surface temperatures in adjacent surface regions 17, 18, 19, differ in a manner that can be measured with an infrared sensor, in particular a pyrometer.

The identifier 16 can take the form of a sequence of structures generated by machining in the course of the shaping of the component 10, 11, 12, 13. The component 10 to 13 can be coated after the application of the structures 7 to 9. However, provision is also made for the structures 7, 8, 9 to be applied only after an otherwise complete manufacture of the component 10 to 13. In this variant, physical features of the component 10 to 13, for example length dimensions, width dimensions, thickness dimensions, or dimensions of surface structures, are determined before the application of the identifier 16. Provision is also made for the material thickness of a coating, with which the component 10 to 13 is coated, to be used as a physical feature.

In one variant of the invention, an identifier 16 is determined from at least one value of one such physical feature. This is then applied in an encrypted form, as a bit sequence in the form of elevations 7, or depressions 8, or cavities 9, on the component 10 to 13. If the identifier 16 is then subsequently read, the value of the physical feature can be reconstructed by means of decryption. It can be compared with the actual physical feature, which is then measured once again. In this way, the recognition of an original part is possible.

Figure 8:
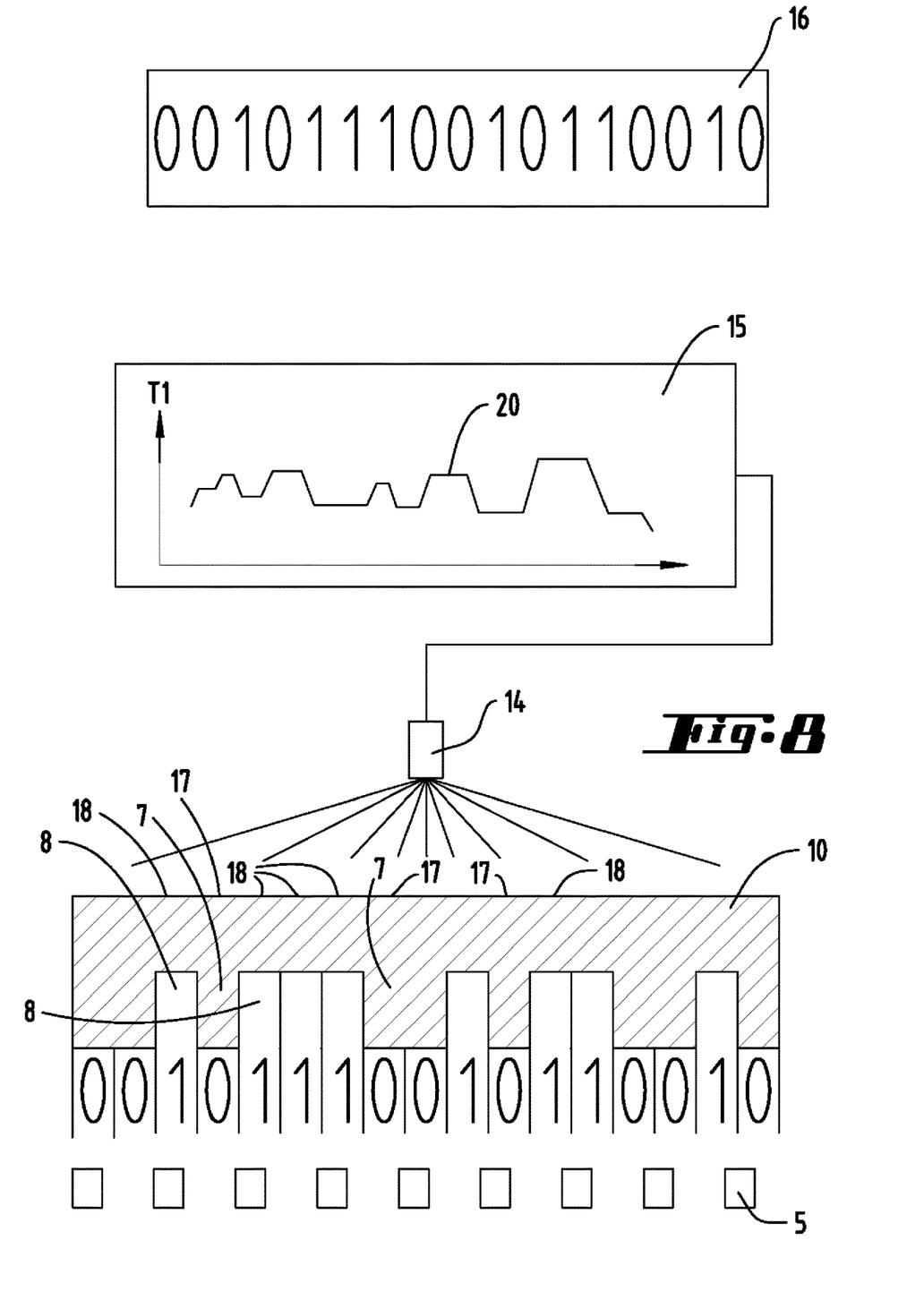
FIG. 8 shows schematically the determination of an individual identifier using a computer of a process control device 15, an infrared sensor 14 and a heater 5.

FIG. 8 shows schematically how the identifier, arranged on the rear face of a susceptor 10, can be read optically by means of an IR-sensor 14.

The susceptor 10 is heated from below using a heater 5. On the lower face there are located adjacent elevations 7 and depressions 8. The surface sections 17 opposite the elevations 7 have a lower surface temperature than the surface sections 18 of the upper face that are opposite the depressions 8. With the IR-sensor 14, a temperature scan of the front face of the susceptor 10, which is facing away from the heater 5, can be produced. The result is the temperature profile 20, which is also shown schematically in FIG. 8, which symbolizes a sensor signal. With the process control device 15, or another computer, the identifier 16 can then be determined from the profile, whereby the binary value zero is assigned to each elevation, and the binary value one is assigned to each depression 8. Here too, the depressions 8 and elevations 7 are shown in a highly exaggerated manner in the interests of clarity.

According to one variant of the invention, provision is made that after the manufacture of a component 10, 11, 12, 13 its relevant physical features are determined. The component is measured optically, or in another manner. The lengths, widths, and thicknesses, or dimensions of other structures of the component, are determined. Furthermore, the thickness and the optical properties of a coating are determined. This can be undertaken either before the application of the structures 7, 8, 9 forming the identifier 16, or afterwards. The physical features determined are stored in a file electronically on a data medium, or on a measurement data sheet. The file is marked with the individual identifier. The measurement data sheet can also be marked with the individual identifier.

It is then possible to recognize the component, which has been replaced in production, for example, by a spare part, in situ in the process chamber 2, since the identifier 16 can be determined by means of an IR-sensor 14, if the component 10 to 13 is heated, that is to say, if a temperature gradient forms between the two broad faces of the component 10 to 13. It is thus possible to determine in the course of operation which component 10 to 13 is present, so as then to intervene in the process, possibly correctively, by the modification of process parameters on the basis of the data previously determined for the physical features.

In one variant of the invention provision is made that, after the manufacture of the component 10 to 13, it is determined by means of model calculations, or by means of experiments, which influences the particularly tolerance-affected physical features have on process variables. Here, in particular, one or a plurality of temperatures come into consideration as process variables, in particular a temperature profile within the process chamber 2, or a lateral temperature gradient on the upper face of the susceptor 10, or of another component. It can then be determined to what extent the process parameter, that is to say, for example, the control of a heater, in particular of its desired or target temperature, must be modified in order to bring the process variable to the desired value. Correction values are hereby generated. These can be communicated to the process control device 15 of a manufacturing device. The manufacturing device is independently able to determine the identifier of the components 10 to 13 installed in the process chamber 2, and then to modify the process parameters of the formulaic specification by an application of the correction values, so that with the replacement part, which differs from the previously installed part, the same process results are also achieved.

Figure 9:
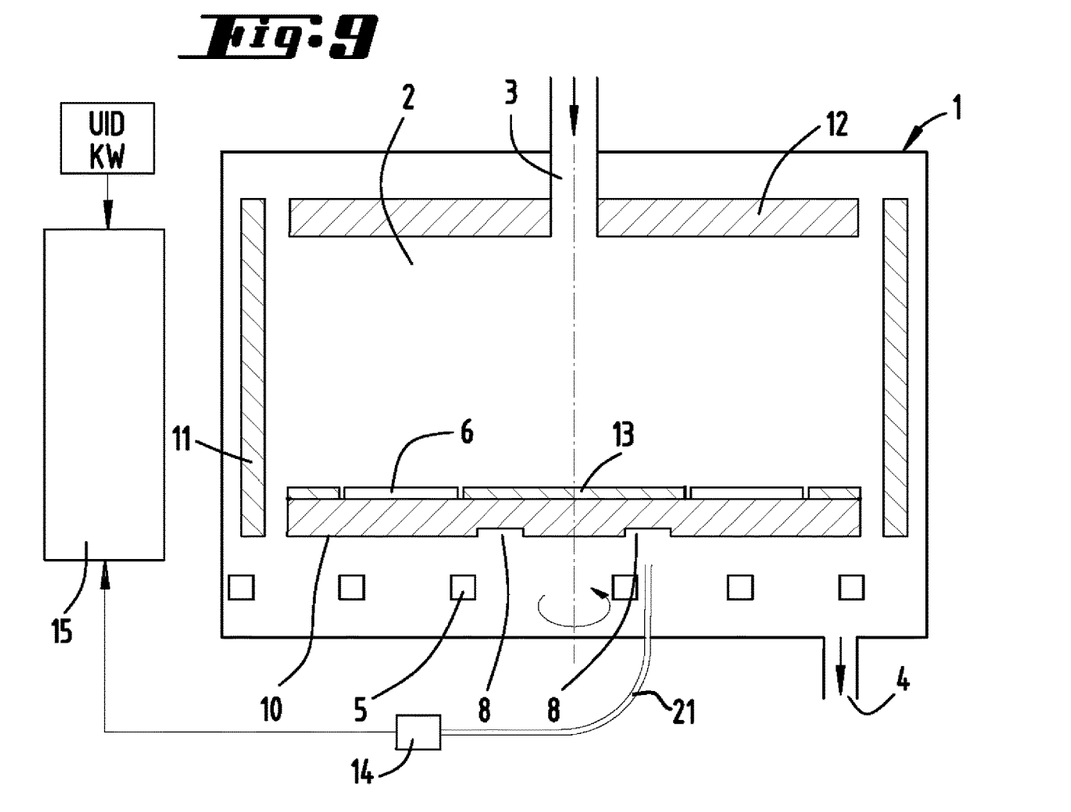
FIG. 9 shows a representation as in FIG. 1, of a further example of embodiment, in which the temperature of a susceptor 10 is measured on its lower face by means of a fiber optic cable 21.

FIG. 9 shows a representation as in FIG. 1. While in the example of embodiment shown in FIG. 1 the temperature of a susceptor 10 is measured on its upper face, that is to say, on the face that is facing away from the heater 5, the example embodiment shown in FIG. 9 has a light guide 21, which is connected at one end to an optical sensor 14, which takes the form of an IR-sensor. The other end of the light guide 21 terminates at a small distance from the face of the susceptor 10 that is facing towards the heater 5. This face bears the depressions 8, which collectively result in a machine-readable identifier. On the face that is facing away from the heater 5, the susceptor 10 supports a cover plate 13, with openings in which substrates 6 are located.

The above statements serve to explain the inventions registered by the application as a whole, which further develop the prior art, at least by means of the following combinations of features, and in each case also independently, wherein two, a plurality, or all of these combinations of features can also be combined, namely:

A component, which is characterized in that the regions are structured with structures 7, 8, 9, resulting in a machine-readable, individual identifier 16.

A device, which is characterized in that the regions are structured with structures (7, 8, 9), resulting in a machine-readable, individual identifier (16).

A method, which is characterized in that volumetric regions of the component 10, 11, 12, 13, associated with adjacent regions 17, 18, 19 of the component 10, 11, 12, 13, are provided with spatial structures 7, 8, 9, which are optically distinguishable from one another, and collectively, as a uniform, contiguous structural arrangement, form an individual identifier 16 that is machine-readable by a sensor 14.

A component, or a device, or a method, which is characterized in that the component 10, 11, 12, 13 of the device 1 is a susceptor 10, a side part 11, a ceiling 12, a cover plate 13, or another component of a CVD process chamber 2.

A component, or a device, or a method, which is characterized in that the structures are formed from elevations 7 or depressions 8, arranged on an external surface of the component 10, 11, 12, 13, from the character of the surface of the external surface, and/or from cavities 9 arranged in the volume.

A component, or a device, or a method, which is characterized in that the structures 7, 8, 9 are arranged along a circular arc line of a component 10 that can be driven such that it rotates about the center of the circular arc line, and/or in that the structures 7, 8, 9 are arranged along a straight line.

A device, or a method, which is characterized in that the sensor 14 is a temperature sensor for the regulation of the temperature of the component, and the controller 15 is equipped such that the identifier can be determined, or is determined, from temporal fluctuations of the sensor signal.

A component, or a device, or a method, which is characterized in that by an evaluation of the sensor signal of the IR-sensor 14 the identifier 16 can be converted, or is converted, into a multiple-digit numeric or alphanumeric character sequence.

A component, or a device, or a method, which is characterized in that the character sequence contains encoded values, and/or in that the character sequence is encrypted, and/or in that the individual identifier 16 contains a value of a particularly tolerance-affected physical feature, which feature can be measured on the component 10, 11, 12, 13), and/or in that an activation function is triggered with the registration of the individual identifier 16.

A component, or a device, or a method, which is characterized in that the regions are surface regions structured by means of roughening, polishing, or applied pigments.

A method for the communication of information to a process control device 15, having the following method steps:

Provision of a component, in which adjacent surface regions of associated volumetric regions of the component 10, 11, 12, 13 are provided with spatial structures 7, 8, 9, which are optically distinguishable from one another, and collectively form a machine-readable individual identifier 16;

Determination of particularly tolerance-affected physical features of the component 10, 11, 12, 13, and/or determination of the influences of the physical feature on the values of process variables in the course of the thermal treatment of a substrate, and of correction values for the correction of process parameters;

Assignment of the correction values and/or the physical features to the individual identifier 16;

Communication of the individual identifier 16, and the physical features, and/or the correction values, to the process control device 15.

A method for the correction of process parameters of a process control device 15 having the following method steps:

Communication of an individual identifier 16, and associated physical features, and/or correction values, to the process control device 15 according to claim 11; installation of the component 10, 11, 12, 13, which bears the individual identifier 16, into the device;

Closure of the device 1;

Determination of the individual identifier 16 of the component 10, 11, 12, 13 installed in the device;

Correction of the process parameters, using the communicated physical features, and/or the correction values.

A component, or a device, or a method, which is characterized in that the regions, in the course of the heating of the component 10, 11, 12, 13, in particular in the event of a heat flow through the component 10, 11, 12, 13, radiate in the infrared spectrum, and in that the sensor is an infrared-sensitive sensor.

A component, which is characterized in that the material thickness and the thermal conductivity of the component 10, 11, 12, 13 are selected such that the structures arranged on a first external surface of the component 10, 11, 12, 13 can be recognized, or are recognized, by the infrared-sensitive sensor 14 on a second external surface facing away from the first external surface.

All disclosed features are essential to the invention (both individually, and also in combination with one another). In the disclosure of the application, the disclosure content of the associated/attached convention documents (transcript of the prior application) is hereby also incorporated in full, also for the purpose of incorporating features of these documents in the claims of the present application. The subsidiary claims characterize, even without the features of a claimed claim, with their features independent inventive developments of the prior art, in particular in order to make divisional applications on the basis of these claims. The invention prescribed in each claim can additionally comprise one or a plurality of the features described in the above description, in particular with features provided with reference symbols and/or prescribed in the list of reference symbols. The invention also relates to configurational forms, in which individual items of the features cited in the above description are not implemented, in particular insofar as it can be recognized that they can be dispensed with for the particular intended purpose, or can be replaced by other technically equivalent means.

LIST OF REFERENCE SYMBOLS

1 CVD reactor
2 Process chamber
3 Gas inlet
4 Gas outlet
5 Heater
6 Substrate
7 Elevation, structure
8 Depression, structure
9 Cavity, structure
9' Cavity, structure
10 Susceptor
11 Side part, component
12 Ceiling, component
13 Cover plate, component
14 IR-sensor
15 Computer, process control device
16 Identifier
17 Surface region
18 Surface region
19 Surface region
20 Sensor signal

What is claimed is:

1. A device (1) for thermally treating at least one substrate (6), the device (1) comprising:
a controller (15);
a sensor (14) communicatively coupled to the controller (15); and
a component (10, 11, 12, 13) comprising:
a first surface;
a second surface facing away from the first surface and facing towards the sensor (14);
structured regions with spatial structures (7, 8) on the first surface, at least two of which are different from one another, and which collectively form a machine-readable identifier (16) of the component (10, 11, 12, 13); and
surface regions (17, 18) on the second surface, each of the surface regions corresponding to one of the structures (7, 8) on the first surface,
wherein during the thermal treatment of the at least one substrate (6), the component (10, 11, 12, 13) is heated with a heating unit (5) to at least a first temperature at which at least two of the surface regions (17, 18) are optically distinguishable from one another with the sensor (14) based on a level of a signal (20) from the sensor (14),
wherein the signal (20) from the sensor (14) captures temperature fluctuations across the surface regions (17, 18) on the second surface of the component (10, 11, 12, 13), the temperature fluctuations corresponding to the spatial structures (7, 8) on the first surface of the component (10, 11, 12, 13), and
wherein the controller (15) is configured to process the temperature fluctuations on the second surface in order to identify the component (10, 11, 12, 13).

2. A method for identifying a component (10, 11, 12, 13), the component comprising a first surface, a second surface facing away from the first surface, structured regions with spatial structures (7, 8) on the first surface, at least two of which are different from one another, and surface regions (17, 18) on the second surface, each of the surface regions corresponding to one of the spatial structures from the structured regions, the method comprising:
heating, with a heating unit (5), the component (10, 11, 12, 13) to at least a first temperature at which at least two of the surface regions are optically distinguishable from one another by an infrared (IR) sensor (14);
sensing, with the IR sensor (14), IR radiation transmitted from the second surface of the component (10, 11, 12, 13), wherein a signal (20) is generated by the IR sensor (14) based on the sensed IR radiation, and wherein the signal (20) captures temperature fluctuations across the surface regions (17, 18) on the second surface of the component (10, 11, 12, 13), the temperature fluctuations corresponding to the spatial structures (7, 8) on the first surface of the component (10, 11, 12, 13); and identifying, with a process control device (15), the component (10, 11, 12, 13) based on the signal (20) generated by the IR sensor (14), wherein the spatial structures (7, 8) collectively, as a uniform, contiguous structural arrangement, form an identifier (16) of the component (10, 11, 12, 13) that is machine-readable by a device (1) comprising the IR sensor (14) and the process control device (15).

3. The device (1) of claim 1, wherein the sensor (14) is a temperature sensor for regularizing a temperature of the component (10, 11, 12, 13).

4. The method of claim 2, wherein identifying the component (10, 11, 12, 13) based on the signal (20) generated by the IR sensor comprises evaluating the signal (20) so as to convert the identifier (16) into a multiple-digit numeric sequence or alphanumeric character sequence.

5. The method of claim 4, wherein at least one of:
the alphanumeric character sequence contains encoded values,
the alphanumeric character sequence is encrypted,
the identifier (16) contains a value of a tolerance-affected physical feature, which feature is measured on the component (10, 11, 12, 13), or
an activation function is triggered with a registration of the identifier (16).

6. The device (1) of claim 1,
wherein the surface regions (17, 18), during the heating of the component (10, 11, 12, 13), radiate in an infrared spectrum, and
wherein the sensor (14) is an infrared-sensitive sensor.

7. The device (1) of claim 6, wherein a material thickness and a thermal conductivity of the component (10, 11, 12, 13) are selected so that the spatial structures (7, 8) on the first surface of the component (10, 11, 12, 13) are recognized by the infrared-sensitive sensor (14) on the second surface.

8. The device (1) of claim 1, wherein the machine-readable identifier (16) is a bar code or a QR-code.

9. The device (1) of claim 1, wherein the component (10, 11, 12, 13) is a member of a group of components being identical in shape, wherein the machine-readable identifier (16) is unique for each of the components.

10. The method of claim 2, wherein the machine-readable identifier (16) is a bar code or a QR-code.

11. The method of claim 2, wherein the component (10, 11, 12, 13) is a member of a group of components being identical in shape, wherein the machine-readable identifier (16) is unique for each of the components.

* * * * *